(12) United States Patent  
Pelley

(10) Patent No.: US 7,285,976 B2  
(45) Date of Patent: Oct. 23, 2007

(54) INTEGRATED CIRCUIT WITH PROGRAMMABLE-IMPEDANCE OUTPUT BUFFER AND METHOD THEREFOR

(75) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 11/047,161

(22) Filed: Jan. 31, 2005

(65) Prior Publication Data

US 2006/0170450 A1    Aug. 3, 2006

(51) Int. Cl.  
H03K 17/16    (2006.01)

(52) U.S. Cl. .......................... 326/30; 326/86; 327/108

(58) Field of Classification Search ................ 326/30, 326/86; 327/108  
See application file for complete search history.

(56) References Cited

U.S. PATENT DOCUMENTS

| | | | |
|---|---|---|---|
| 4,719,369 A | 1/1988 | Asano | |
| 4,761,647 A | 8/1988 | Hallenbeck | |
| 5,107,230 A | 4/1992 | King | |
| 5,153,450 A | 10/1992 | Reutz | |
| 5,319,258 A | 6/1994 | Ruetz | |
| 5,387,824 A | 2/1995 | Michelsen | |
| 5,606,275 A | 2/1997 | Farhang | |
| 5,859,541 A | 1/1999 | McMahan | |
| 6,259,282 B1* | 7/2001 | Morris | 327/112 |
| 6,330,193 B1* | 12/2001 | Yu et al. | 365/189.05 |
| 6,356,106 B1* | 3/2002 | Greeff et al. | 326/30 |
| 6,424,175 B1* | 7/2002 | Vangal et al. | 326/82 |
| 6,657,512 B2 | 12/2003 | Thompson | |
| 6,690,191 B2* | 2/2004 | Wu et al. | 326/30 |
| 6,836,142 B2* | 12/2004 | Lesea et al. | 326/30 |

FOREIGN PATENT DOCUMENTS

| | | |
|---|---|---|
| JP | 62-38616 | 2/1987 |
| JP | H2-122725 A | 5/1990 |
| JP | 2-170572 A | 7/1990 |
| JP | 4-63016 A | 2/1992 |
| JP | 5-211432 A | 8/1993 |
| JP | 5-308272 A | 11/1993 |
| JP | 6-268505 | 9/1994 |

OTHER PUBLICATIONS

JEDEC Standard, Double Data Rate (DDR) SDRAM Specification, JESD79, Release 2, May 2002, pp. 1-79, no date.  
JESD79-2, DDR2 SDRAM Specification, Mar. 2003, pp. 1-79, no date.

* cited by examiner

Primary Examiner—Vibol Tan  
(74) Attorney, Agent, or Firm—James L. Clingan, Jr.

(57) ABSTRACT

An impedance matching between two integrated circuits is achieved using an impedance measuring circuit in the integrated circuit that contains an impedance-programmable output buffer (IPOB) that is to have its output impedance changed. The impedance measuring device is directly connected to the output of the IPOB so that it is detecting the same impedance that the IPOB will drive and thereby avoids the errors of measuring the resistance of a device that imperfectly models the actual impedance. The impedance measuring device is preferably an analog to digital (A/D) converter that provides a digital output relative to the voltage present on the same terminal as the output of the IPOB. By having the A/D converter on the same integrated circuit as the IPOB, communications difficulties between the A/D converter and the IPOB are minimal.

17 Claims, 2 Drawing Sheets

US 7,285,976 B2

INTEGRATED CIRCUIT WITH PROGRAMMABLE-IMPEDANCE OUTPUT BUFFER AND METHOD THEREFOR

FIELD OF THE INVENTION

This invention relates to integrated circuits, and more particularly to integrated circuits with programmable-impedance output buffers.

BACKGROUND OF THE INVENTION

As speeds of operation have increased for various processing circuits, such as microprocessors that interface with DRAMs, the lines that carry the signals that switch at high speeds can begin to function as transmission lines. This has become of particular importance in a the operation of a motherboard having a processor in one integrated circuit and DRAMs in a memory stick. These are interconnected by a bus, a plurality of lines, on the motherboard. The bus speeds on the motherboard are now commonly 500 megahertz. At these speeds and line lengths, there are reflections at the terminations unless care is taken to prevent that. The typical answer is to terminate the line at a relatively low resistance such as 50, 75, or even 150 ohms that matches the transmission impedance of the line. A lower termination resistance causes higher the power consumption so the termination resistance is preferably the higher of the possible options. A variety of factors influence the transmission impedance so that it is not always feasible to have the higher resistance value.

The effectiveness of the termination is also based on the ability of the output impedance of the circuit generating the signal, an output buffer, and the termination resistance to match the transmission impedance. It is difficult to match the transmission impedance, output impedance, and termination resistance perfectly due to processing variations in the manufacturing processes, in temperature, and in power supply voltage. A solution to this has been to use impedance-programmable output buffers. Difficulties in implementing this have included complex communications between the output buffer and the controller thereof and requirement of external components that do not track the actual conditions.

Thus, there is a need for achieving impedance matching that overcomes or reduces one or more of these difficulties.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE INVENTION

In one aspect an impedance matching between two integrated circuits is achieved using an impedance measuring circuit in the integrated circuit that contains an impedance-programmable output buffer (IPOB) that is to have its output impedance changed. The impedance measuring device is directly connected to the output of the IPOB so that it is detecting the same impedance that the IPOB will drive and thereby avoids the errors of measuring the resistance of a device that imperfectly models the actual impedance. The impedance measuring device is preferably an analog to digital (A/D) converter that provides a digital output relative to the voltage present on the same terminal as the output of the IPOB. By having the A/D converter on the same integrated circuit as the IPOB, communications difficulties between the A/D converter and the IPOB are minimal. This is better understood with reference to the drawings and the following description.

Figure 1:
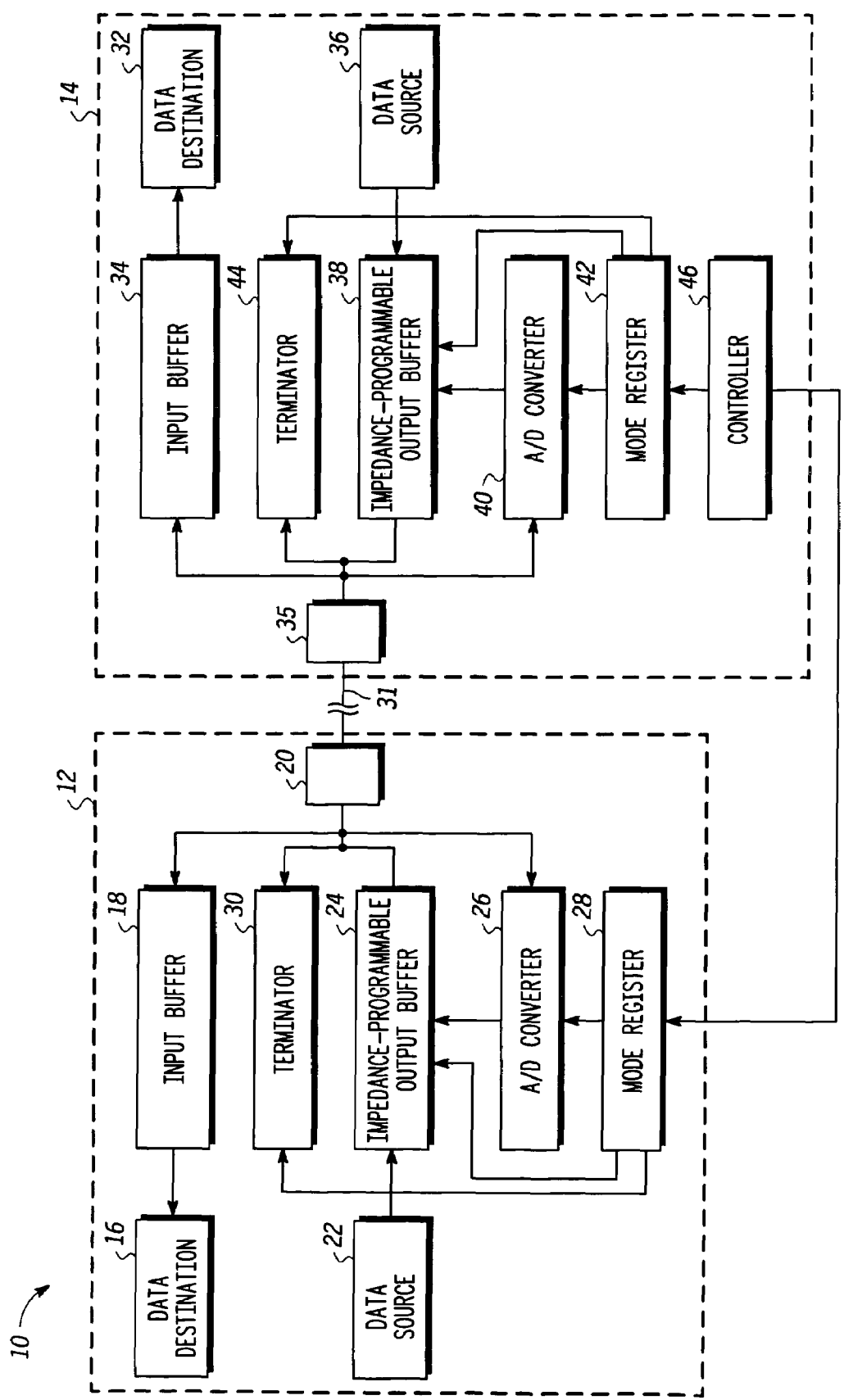
FIG. 1 is a block diagram of a system according to an embodiment of the invention.

Shown in FIG. 1 is a system 10 comprising an integrated circuit 12 and an integrated circuit 14. Integrated circuit 12 comprises a data destination 16 having an input, an input buffer 18 having an output connected to the input of data destination 16 and an input, an external terminal 20 connected to the input of input buffer 18, a data source 22 having an output, an IPOB 24 having an input connected to the output of data source 22 and an output connected to external terminal 20, an A/D converter 26 having an input connected to external terminal 20 and an output connected to IPOB 24, a mode register 28 having an input, a first output, a second output connected to IPOB 24, and a third output connected to A/D converter 26, and a terminator 30 having a first input connected to external terminal 20 and a second input connected to the first output of mode register 28. External terminal 20 is connected to a line 31 that has the characteristics of a transmission line at the operating speeds of integrated circuits 12 and 14. Integrated circuit 14 comprises a data destination 32 having an output, an input buffer 34 having an output connected to the input of data destination 32 and an input, an external terminal 35 connected to the input of input buffer 34, a data source 36 having an output, an IPOB 38 having an input connected to the output of data source 36 and an output connected to external terminal 35, an A/D converter 40 having an input connected to external terminal 35 and an output connected to IPOB 38, a mode register 42 having a first input, a first output, a second output connected to IPOB 38, and a third output connected to A/D converter 40, a terminator 44 having a first input connected to external terminal 35 and a second input connected to the first output of mode register 42, and a controller 46 having a first output connected the input of mode register 28 and a second output connected to the input of mode register 42. External terminal 35 is connected to line 31.

Line 31 is shown as just connected between integrated circuits 12 and 14 but other integrated circuits that are not shown may also be connected to line 31. Further both integrated circuits 12 and 14 would have many more external terminals than shown. Data source 22 can be any source of a signal that is to be supplied as an external signal such as an output of a main memory. Similarly, data destination 32 can be any type of circuit that receives external signals such as a buffer for a cache memory. IPOBs 24 and 38 are preferably output buffers that are made programmable using binary-weighted transistors. A/D converters 26 and 40 preferably comprise an inverter, a binary counter, and a reference voltage. Mode registers 28 and 42 receive information from controller 46 and use that information to select the different modes of operation of integrated circuits 12 and 14, respectively. External terminals 20 and 35 are the physical interface external to integrated circuits 12 and 14, respectively. In this example, wire 31 is bi-directional so that information can flow from integrated circuit 12 to integrated circuit 14 or from integrated circuit 14 to integrated circuit 12.

Figure 2:
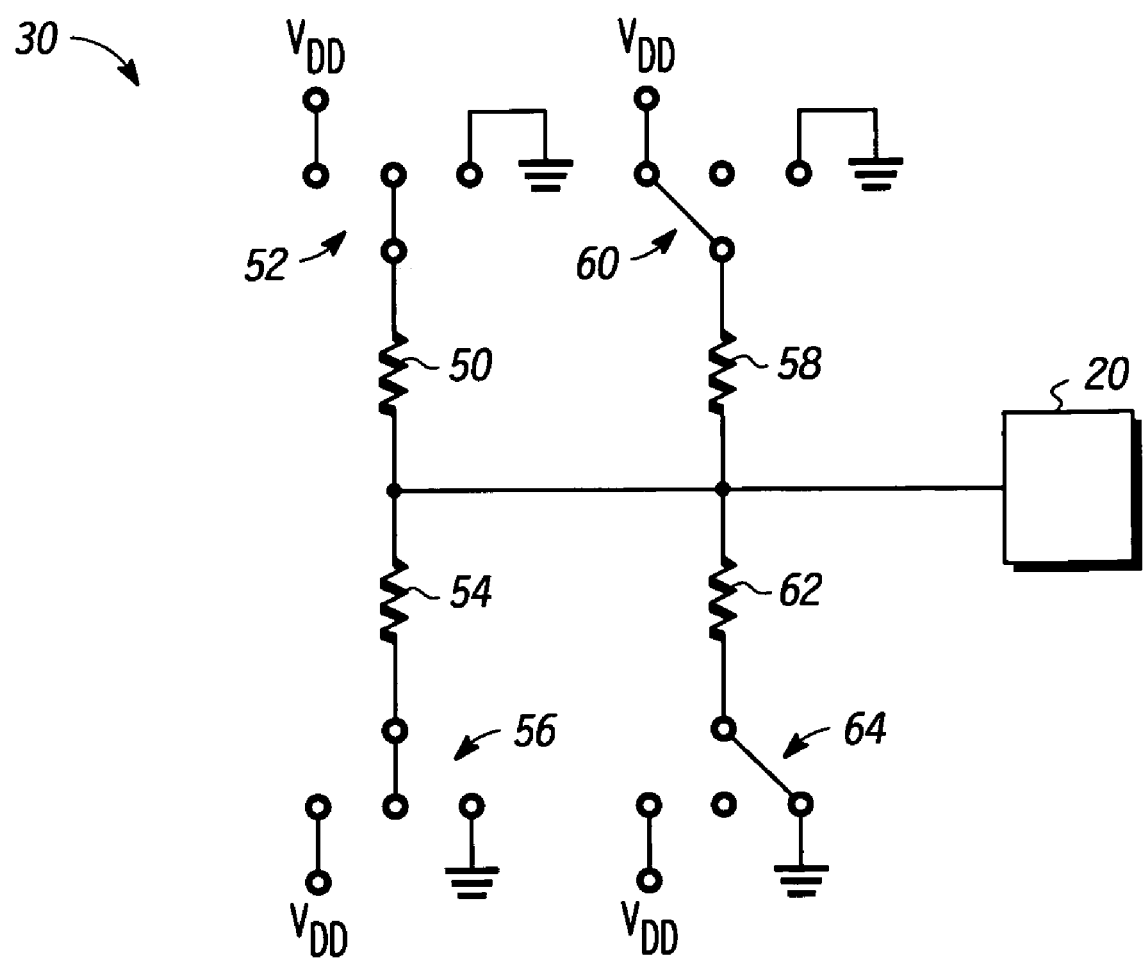
FIG. 2 is a circuit diagram of a portion of the system of FIG. 1.

Shown in FIG. 2 is terminator 30 in more detail. Terminator 30 comprises resistors 50, 54, 58, and 62 and single-pole triple-throw switches 52, 56, 58, and 64. Each of switches 52, 56, 58, and 64 has a common terminal connected to one of resistors 50, 54, 58, and 62 and three selectable alternative terminals in which one is connected to ground, another is connected to VDD, and a third is unconnected. Resistor 50 has a first terminal connected to the common terminal of switch 52 and a second terminal. Resistor 54 has a first terminal connected to common terminal of switch 56 and a second terminal connected to the second terminal of resistor 50. Resistor 58 has a first terminal connected to the common terminal of switch 60 and a second terminal connected the second terminals of resistors 50 and 54. Resistor 62 has a first terminal connected to the common terminal of switch 64 and a second terminal connected to the second terminals of resistors 50, 54, and 58. External terminal 20 is connected to the second terminals of resistors 50, 54, 58, and 62. Switches 52, 56, 60, and 64 are preferably comprised of transistors that are connected to perform the single-pole triple-throw function. Preferably resistors 50 and 54 are 150 ohms each and resistors 58 and 62 are 300 ohms each. Terminator 44 has the same configuration as terminator 30 as shown in FIG. 2. VDD in this example is a positive power supply voltage that is preferably about 2.5 volts. Although not shown in FIG. 2, switches 52, 56, 60, and 64 are controlled by mode register 28 which is shown in FIG. 1 as being connected to terminator 30.

In operation integrated circuits 12 and 14 function together to perform tasks established by a designer of system 10. In this example, line 31 carries high frequency signals such that terminators 30 and 44 are required to prevent these signals from ringing, which is caused by transmission line reflections. In the case of integrated circuit 12 supplying signals to integrated circuit 14 from IPOB 24 to input buffer 34, terminator 44 provides a termination resistance useful in preventing the ringing.

Prior to beginning operation, IPOB 24 is programmed to optimize operation with respect to terminator 44. The programming mode is entered by the action of controller 46 which provides this information to mode registers 28 and 42. Mode register 28 causes terminator 30 to be open, IPOB 24 to be enabled for calibration, and A/D converter 26 to be enabled. Mode register 42 causes terminator 44 to be open, configured for calibration, IPOB 38 to be disabled, and A/D converter 40 to be disabled. The resistance of terminator 44 establishes a known operating reference for the calibration of IPOB 24. IPOB 24 and terminator 44 establish a voltage divider. A/D converter 26 detects if the voltage at external terminal 20 is higher or lower than the reference voltage contained within A/D converter 26 and signals IPOB 24 to change impedance accordingly. The output impedance of IPOB 24 is thus continuously altered until the voltage at external terminal 20 is the same as the reference voltage. This calibration process is for both pull-down and pull-up functioning of IPOB 24. For the pull-up calibration, terminator 44 operates with selected resistors switched to ground. For example, the analogous resistors of 50 and 54 could both be coupled to ground for 75 ohm operation while analogous resistors 58 and 62 would be left disconnected. Analogous resistors 58 and 62 would be connected to ground and analogous resistors 50 and 54 would be unconnected for 150 ohm operation. For pull-down calibration of IPOB 24, the selected resistors of terminator 44 would be connected to VDD. Switching between pull-up and pull-down calibration is controlled by controller 46 through mode registers 28 and 42.

Calibration of IPOB 38 follows the same pattern for the calibration of IPOB 24. Controller 46 causes entry into calibration by proper signals to mode registers 28 and 42. Mode register 42 causes terminator 44 to be open, IPOB 38 to be enabled for calibration, and A/D converter 40 to be enabled. Mode register 28 causes terminator 30 to be configured for calibration, IPOB 24 to be disabled, and A/D converter 26 to be disabled. The impedances of IPOB 38 and terminator 30 establish a voltage divider. A/D converter 40 detects if the voltage at external terminal 35 is higher or lower than the reference voltage contained within A/D converter 40 and signals IPOB 38 to change impedances accordingly. The output impedance of IPOB 38 is thus altered until the voltage at external terminal 35 is the same as the reference voltage. As for IPOB 24, the pull-up and pull-down operations are done separately. The selected resistors of terminator 30 are connected to ground for pull-up and connected to VDD for pull-down calibration while the other resistors are unconnected.

Normal operation is implemented by controller 46 providing the proper signals to mode registers 28 and 42, which in turn disable A/D converters 26 and 40 and configure terminators 30 and 44 for normal operation. For example, if 75 ohms is normal operation, and integrated circuit 12 is receiving a signal from integrated circuit 14 via line 31, switch 52 of terminator 30 will couple resistor 50 to VDD, and switch 56 will couple resistor 54 to ground. In such case terminator 44 will have all resistors unconnected. On the other hand, if integrated circuit 14 is receiving a signal from integrated circuit 12 via line 31, terminator 30 has all of its resistors unconnected and terminator 40 has a selected resistor coupled to ground and another selected resistor coupled to VDD. Another mode of normal operation is that the IPOB 24 and/or IPOB 38 can have its impedance switched to a multiple of the calibrated value. Similarly, the calibration itself may be set to a multiple of the resistance of the terminator being used for calibration by adjusting the reference voltage of the A/D converter.

Various changes and modifications to the embodiments herein chosen for purposes of illustration will readily occur to those skilled in the art. For example, the calibration was described using a single terminator, but there may be situations in which there are multiple integrated circuits receiving signals from a single IPOB and the calibration of such IPOB could involve a terminator from each of the integrated circuits that receive signals from the IPOB. Also the impedance measuring and calibration circuit was described as being an A/D converter, another type impedance measuring device may also be used. The positive power supply voltage has been shown as a single voltage VDD, but the positive power supply voltage may differ for different embodiments. For example a lower level may be used for IPOBs 24 and 38. Similarly, a different negative power supply voltage may be substituted for ground. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

What is claimed is:
1. An integrated circuit, comprising:
   an impedance-programmable output buffer (IPOB) coupled to an external terminal, wherein the external terminal is for being connected to a transmission line; and an impedance detector, comprising an analog to digital converter, coupled to the IPOB and the external terminal for measuring a termination resistance coupled to the transmission line and providing an input to the IPOB for causing the IPOB to have an output impedance with a predetermined relationship to the termination resistance, wherein the measuring the termination resistance occurs during enablement of the IPOB.

2. The integrated circuit of claim 1, wherein the predetermined relationship is the same resistance.

3. The integrated circuit of claim 1, further comprising a terminator and an input buffer coupled to the external terminal.

4. The integrated circuit of claim 3, wherein the terminator is disabled when the IPOB is enabled.

5. The integrated circuit of claim 3, wherein the integrated circuit has a calibration mode for the terminator acting as an impedance reference.

6. The integrated circuit of claim 5, wherein the terminator is coupled to only one of first power supply terminal and ground during a portion of the calibration mode.

7. A system, comprising:
a first integrated circuit for receiving signals along a transmission line, the first integrated circuit comprises a terminator; and
a second integrated circuit for providing the signals to the first integrated circuit along the transmission line, the second integrated circuit comprising:
an IPOB coupled to the transmission line; and
an impedance measuring circuit, comprising an analog to digital converter, coupled to the transmission line for measuring a resistance of the terminator and adjusting an output impedance of the IPOB, wherein the measuring the termination resistance occurs during enablement of the IPOB.

8. The system of claim 7, wherein the impedance measuring circuit causes the output impedance of the IPOB to match the resistance of the terminator.

9. The system of claim 7, the impedance measuring circuit causes the output impedance of the IPOB to be a predetermined multiple of the resistance of the terminator.

10. The system of claim 7, wherein the second integrated circuit further comprises an input buffer and a second terminator coupled to the transmission line, wherein the second terminator is disabled when the IPOB is enabled.

11. The system of claim 7, wherein the terminator is coupled to only one of first power supply terminal and ground during a portion of time when the impedance measuring circuit is measuring a resistance of the terminator.

12. A method of adjusting an output impedance of an IPOB of an integrated circuit in which the IPOB is coupled to an external terminal of the integrated circuit, comprising:
coupling the external terminal to a transmission line;
coupling a terminator that is external to the integrated circuit to the transmission line;
using a resistance of the terminator and the output impedance of the IPOB during enablement of the IPOB to adjust the output impedance of the IPOB, using an analog to digital converter, to a predetermined multiple of the resistance of the terminator.

13. The method of claim 12, wherein the step of using the resistance and the output impedance to adjust the output impedance is further characterized by operating the IPOB and the terminator as a voltage divider.

14. The method of claim 12 wherein the terminator is in a second integrated circuit that has a second external terminal coupled to the transmission line, wherein the terminator is coupled to the second external terminal.

15. The method of claim 12, further comprising coupling the terminator to only one of a first power supply terminal or ground during a portion of the using the resistance of the terminator.

16. The method of claim 12, wherein the using the resistance of the terminator is further characterized as adjusting the output impedance of the IPOB to match the resistance of the terminator.

17. The method of claim 12, wherein the terminator comprises a plurality of terminators in a plurality of integrated circuits.

* * * * *